(12) United States Patent
Seltmann et al.

(10) Patent No.: US 7,325,224 B2
(45) Date of Patent: Jan. 29, 2008

(54) METHOD AND SYSTEM FOR INCREASING PRODUCT YIELD BY CONTROLLING LITHOGRAPHY ON THE BASIS OF ELECTRICAL SPEED DATA

(75) Inventors: Rolf Seltmann, Dresden (DE); Heiko Wagner, Dresden (DE); Rolf Stephan, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 412 days.

(21) Appl. No.: 10/987,427

(22) Filed: Nov. 12, 2004

(65) Prior Publication Data

US 2005/0120328 A1    Jun. 2, 2005

(30) Foreign Application Priority Data

Nov. 28, 2003 (DE) ................. 103 55 573

(51) Int. Cl.
*G06F 17/50* (2006.01)
(52) U.S. Cl. ............... 716/21; 716/4; 716/8; 716/11; 716/19
(58) Field of Classification Search ........... 716/19–21, 716/4, 8, 11
See application file for complete search history.

(56) References Cited

U.S. PATENT DOCUMENTS

| | | | |
|---|---|---|---|
| 6,405,144 B1 | 6/2002 | Toprac et al. | 702/84 |
| 6,449,749 B1 * | 9/2002 | Stine | 716/4 |
| 6,493,063 B1 | 12/2002 | Seltmann et al. | 355/53 |
| 6,915,177 B2 * | 7/2005 | Phan et al. | 700/109 |

FOREIGN PATENT DOCUMENTS

WO    WO 03/017322 A2    2/2003

OTHER PUBLICATIONS

Ackmann et al., "Use of Exposure compensation to improve device performance for speed and binning based on electrical parametric feedback into fabrication design," SPIE, 3051:384-90, 1997.

* cited by examiner

*Primary Examiner*—Jack Chiang
(74) *Attorney, Agent, or Firm*—Williams, Morgan & Amerson

(57) ABSTRACT

The electrical performance of sub-devices is detected and the corresponding measurement data is used to control a lithography process so as to compensate for any type of process variations during a manufacturing sequence.

41 Claims, 5 Drawing Sheets

METHOD AND SYSTEM FOR INCREASING PRODUCT YIELD BY CONTROLLING LITHOGRAPHY ON THE BASIS OF ELECTRICAL SPEED DATA

BACKGROUND OF THE INVENTION

1. Field of the Invention

The present invention relates to the fabrication of integrated circuits, and, more particularly, to a control strategy to improve uniformity of circuit elements across the substrate area by controlling a lithography process.

2. Description of the Related Art

The fabrication of integrated circuits is accomplished by forming a large number of elements, such as transistors, capacitors, resistors and the like, on a single substrate, wherein semiconductive, conductive and insulating material layers are deposited, patterned and modified so as to finally obtain the circuit elements and any electrical connections in accordance with a basic circuit design. For instance, in a modern CPU (central processing unit), millions of field effect transistors, which represent the backbone of the circuit design, are commonly manufactured in accordance with specified design rules that substantially determine the performance of the completed circuit.

Generally, the physical size of the circuit elements, for instance of the field effect transistors, essentially determines the electrical behavior, for instance the operating speed, of the integrated circuit. Hence, a minimal variation during the manufacturing processes directly concerning the formation of circuit elements of critical size may result in a minimal variation of the sizes of circuit elements or portions thereof, which then, in turn, may result in a reduced overall operating speed as the total operating speed of a circuit or a functional block thereof is determined by the slowest component. It is therefore, important to control the manufacturing processes to be as uniform as possible within a single die area and also within the entire substrate surface bearing a large number of dies. In the fabrication of integrated circuits, a large number of individual process steps are typically involved, wherein most of the process steps are performed on a full wafer basis, i.e., the processes are performed simultaneously all over the substrate surface. However, the ever increasing size of the substrates used in the production of semiconductors may render it difficult to precisely control the process conditions to be uniform across the entire substrate. Thus, a local variation of the effects of a certain process may be generated, which, in turn, entails a variation of the electrical behavior. On the other hand, a few manufacturing processes may be performed only at a portion of the substrate, thereby allowing an improved controllability of the process conditions at specified substrate positions with respect to the process uniformity. For instance, a manufacturing sequence for complex integrated circuits may, among many others, include the following essential process steps, such as photolithography, etching, dopant implantation, annealing and metrology processes, wherein photolithography and metrology steps are usually process steps that are performed on substrate portions rather than all over the entire substrate surface in one step. Consequently, these processes performed only at portions of the substrate provide the possibility to detect local non-uniformities of the entire process flow by measurement and also offer the potential for compensating for detected process non-uniformities by adjusting process parameters of the lithography process in conformity with the measurement results.

In presently established process technologies, photolithography plays a dominant role, since the lithographic generation of a resist feature substantially determines the finally obtained critical dimension of an actual circuit element. A critical dimension (CD) of a circuit element may represent, for instance, a minimum feature size, such as a width of lines or spaces of a critical circuit pattern. For instance, a gate electrode of a field effect transistor is substantially a line-like circuit element, wherein the width thereof substantially determines the operating speed of the field effect transistor. Hence, great efforts are being made to precisely control the critical dimensions of resist features produced by photolithography, which are then used as an etch mask for a subsequent etch process to pattern a material layer. In photolithography, the process of transferring an image from a reticle into a UV sensitive photoresist layer was dominated for a long time by so-called wafer steppers, which generate a reduced image of the reticle on a specified portion of the substrate. The exposed substrate portion will also be referred to as the reticle field and typically includes a plurality of individual die, wherein the number of individual die depends on the size of the die, i.e., on the complexity of the integrated circuit to be formed in the die, and on the size of the reticle field that the wafer stepper is able to produce during a single exposure step. Recently, wafer steppers are increasingly replaced by so-called step and scan systems, briefly denoted as scanners, which use a synchronized scanning of the substrate and the reticle through a fixed slit arranged within the associated optics. Consequently, the scanning of the substrate and the reticle is typically controlled so as to minimize any exposure non-uniformities within the exposure field to thereby minimize a variation of critical dimensions of the circuit elements, as already a variation of the critical dimension of the order of one nanometer or even less may translate into a corresponding speed variation for the completed device. During the lithography process, many factors may contribute to a deviation from the target critical dimension, resulting in an increased variation across the reticle field. Some of these factors are the variations in resist thickness and variations of the development process, imperfections of the lens and the reticle and synchronization errors between the substrate and the reticle during the scanning operation. In order to minimize these errors in imaging a circuit pattern onto a substrate, the exposure process is controlled to adapt an exposure dose, i.e., an integrated intensity of UV radiation irradiated onto a defined position of the substrate, in accordance with measurement results of critical dimensions obtained by previously processed substrates.

In this respect U.S. Pat. No. 6,493,063 by Seltmann et al. discloses a method and an apparatus for reducing the variance of critical dimensions in a semiconductor device in that lens and reticle errors are measured and are then compensated for. In particular, the critical dimension of a die is measured and is used to create a critical dimension function CD (x,y), wherein "y" represents the direction of scan and "x" is perpendicular to the direction of scan for a lithography scanner. CD (x,y) is then used to determine the energy distribution, i.e., the exposure dose, as a two-dimensional function E(x,y). Finally, the two-dimensional function E(x, y) is separated into two orthogonal functions E(x) and E(y), wherein a variation in E(x) and E(y), i.e., a deviation from specified target values for these functions, is compensated for by correspondingly adapting the exposure dose or using gray filters or other means. In this way, the lithography-associated variations of critical dimensions may effectively be compensated for or at least significantly reduced.

As previously explained, a large number of process steps is involved in the production of integrated circuits, wherein each process step may contribute to a variation of critical dimensions and/or a variation of the electrical behavior of a circuit element owing to local process fluctuations, wherein the impact on the finally obtained circuit element depends on the specific process. For instance, the gate length is an important critical dimension, which is according to present technologies, determined, to a dominant part, by the photolithography process. However, the effective length of the channel, although substantially defined by the gate length, depends, among other things, on the profile of the dopant concentration forming PN-junctions in a channel region of the field effect transistor. The dopant profile, however, depends on implantation parameters and especially on parameters of a subsequent anneal process for activating dopants and curing, at least partially, implantation-induced damage of the crystalline semiconductor region. As a consequence, variations and local non-uniformities of the implantation process and/or the anneal cycles may also contribute to a variation of the device performance, which may not be compensated for by the above-described technique, since only CD-induced variations are taken into consideration.

In view of the problem identified above, there exists a need for enhanced control strategy that enables effective compensation for device performance variation caused by local process non-uniformities of a plurality of processes involved in manufacturing integrated circuits. The present invention is directed to overcoming, or at least reducing the effects of, one or more of the problems set forth above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the reduction of, or compensation for effects of, process non-uniformities of a sequence of manufacturing processes on the basis of electrical measurement data. To this end, the photolithography process is controlled on the basis of electrical measurement data, which reflect the influence of a plurality of parameters of manufacturing processes on the performance of at least a portion of the integrated circuit to be formed. According to the present invention, advantage may be taken of the fact that, in typical designs of moderate complex integrated circuits, one or more small, fully functioning sub-circuits, also referred to as sub-devices, are included, which enable access by metrology tools or electrical probing devices prior to the completion of the manufacturing process for the entire device. Consequently, due to the relatively small die area occupied by these sub-devices, compared to the overall area used for the complete circuit design, local electrical measurement data may be available that allows the assessment of the performance, e.g., the operating speed, of the sub-devices and, based on this assessment, also enables the estimation of the performance to be expected for the entire integrated circuit. Based on this electrical measurement data, the photolithography process, which allows local control of process parameters, is controlled so as to reduce or compensate for non-uniformities indicated by the measurement data.

According to one illustrative embodiment of the present invention, a method comprises obtaining measurement data indicative of electrical performance capability of a plurality of functional circuit portions of specified design and arranged within a reticle field formed on a substrate. Then, a two-dimensional representation of the measurement data for the reticle field is determined. Finally, a lithographic process for one or more product substrates is controlled on the basis of the two-dimensional representation.

According to still another illustrative embodiment of the present invention, a method comprises designing a layout for a reticle including a plurality of primary circuit designs, each of which is associated with at least one secondary circuit design of reduced complexity. Moreover, the method comprises forming a hardware representation of the layout on a substrate by process tools, including a lithography apparatus using the reticle. Additionally, measurement data is obtained that is indicative of an electrical performance of the secondary circuits. Finally, on the basis of the measurement data, a map is determined that relates a critical dimension of the layout to a position of a reticle field formed on the substrate.

According to a further illustrative embodiment of the present invention, a lithography tool comprises a controllable illumination system responsive to exposure dose data and a control section configured to provide exposure dose data on the basis of CD data. The lithography tool further comprises a control unit configured to receive a two-dimensional representation of electrical performance data and to calculate CD data on the basis of reference CD data.

BRIEF DESCRIPTION OF THE DRAWINGS

The invention may be understood by reference to the following description taken in conjunction with the accompanying drawings, in which like reference numerals identify like elements, and in which.

Figure 1A:
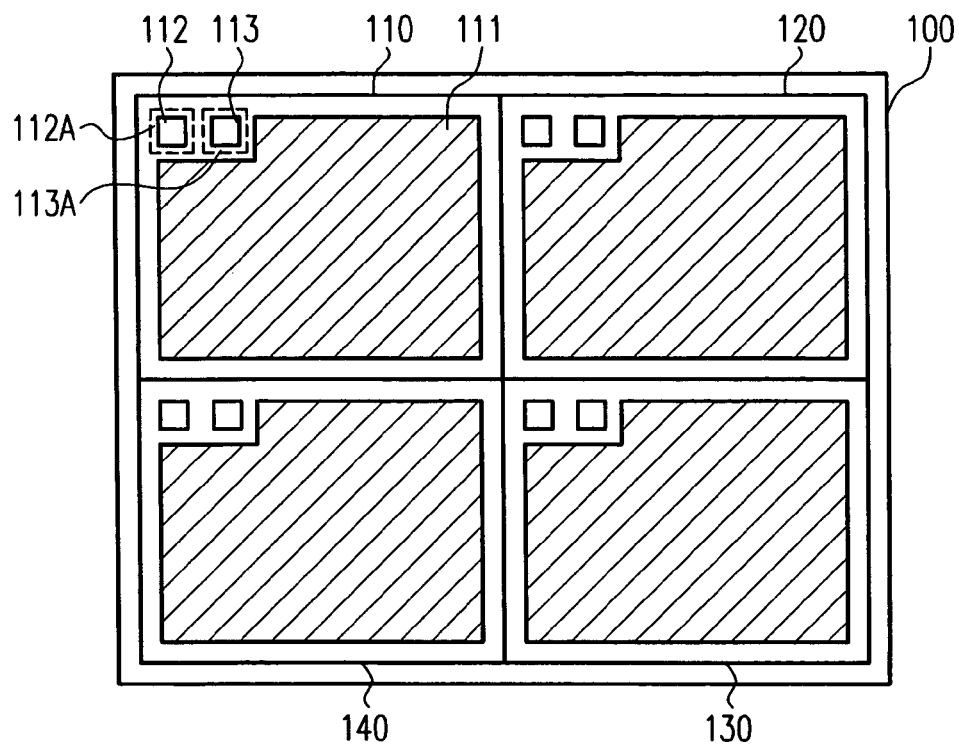
FIGS. 1a-1c schematically show top views of a reticle including four individual die areas, wherein each die area contains a layout of a primary circuit and a plurality of layouts of secondary circuits of reduced complexity.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept of using measurement data indicative of the electrical performance capability of localized sub-devices so as to estimate, on the basis of local measurement data, a substantially continuous two-dimensional representation or a two-dimensional representation including at least a large number of discrete positions within an individual reticle field, thereby relating an expected electrical performance of the circuit design under consideration, quantified by an appropriate numerical value, to the corresponding position within the reticle field. Moreover, the two-dimensional representation or the two-dimensional map of the electrical performance data, which represents the entirety of parameters influencing the manufacturing process, may then be related to an exposure dose used for the lithography process in forming critical circuit elements, since, as previously discussed, the photolithography provides the possibility of locally adapting process parameters of the exposure process, that is adapting the exposure dose, as a function of the position within the reticle field. Based on the relation between the electrical performance and the exposure dose, the lithography process for product substrates may then be performed, wherein, in some embodiments, a continuous update of further electrical measurement data ensures an efficient control strategy, whereas, in other embodiments, a correlation is established between critical dimensions of specified circuit elements and the electrical performance measurement data so as to enable the detection of process fluctuations by means of precisely performed critical dimension measurements, which may be carried out on the basis of specifically designed CD metrology reticles.

With reference to FIGS. 1a-3, further illustrative embodiments of the present invention will now be described in more detail. FIG. 1a illustrates a schematic top view of a reticle 100 which includes, in the present example, four individual die areas 110, 120, 130, 140. However, the number of individual dies per reticle depends on the size of the layout of a specified integrated circuit to be formed within an individual die and on the capability of the lithography tool. Consequently, the reticle 100 may contain at least one individual die area 110 . . . 140 or may include a plurality of individual die areas depending on the complexity of the circuit design. In this respect, a circuit design is considered as the functional relationship between the plurality of circuit elements forming the integrated circuit under consideration. A layout of a specified circuit design, as used in this specification, is to be understood as the physical representation of the specified circuit design, i.e., the layout comprises the physical components, or the physical images thereof when reference is made to the layout in the reticle 100, such as conductive lines, field effect transistors, including gate electrodes and source and drain regions, capacitors and the like. Hence, the layout of a specified circuit design may be changed by re-arranging one or more circuit elements, without altering the specified circuit design, that is, the functionality of the circuit.

The reticle 100 further comprises, in each of the die areas 110 . . . 140, a primary circuit design 111, which may represent, for instance, a main portion of a CPU, and the like. Moreover, each die area further comprises one or more secondary circuit designs 112, 113, wherein it should be appreciated that the primary and the secondary circuit designs 111, 112 and 113 are illustrated with a specified layout such that the secondary circuit designs 112, 113 are located, in this example, on the upper left corner of the individual die areas 110, . . . 140. The secondary circuit designs 112, 113 may represent fully functional circuits of significantly reduced complexity compared to the primary circuit design 111. Consequently, the layout for the secondary circuit designs 112, 113 is localized in a sense that it occupies significantly less space within the die area 110 . . . 140 compared to the primary circuit design 111.

The secondary circuit designs 112, 113 may, in particular embodiments, be operatively connected to the primary circuit design 111 and, thus, may represent a portion of the integrated circuit under consideration. For instance, the secondary circuit designs 112, 113 may represent clock circuits for providing corresponding clock signals to various sections of the primary circuit design 111. In other embodiments, however, one or more secondary circuit designs may be added as a measurement structure without being required for the operation of the primary circuit design 111. In this case, advantageously, the layout of the secondary circuit design is kept as small as possible so as to not unduly occupy precious chip area. Moreover, when designing a secondary circuit design as a test structure, it may be advantageous to include a plurality of critical circuit elements, i.e., of circuit elements including minimal critical dimensions, thereby providing the potential for detecting even slight variations in the manufacturing sequence.

Each of the secondary circuit designs 112, 113 may have associated therewith a specified neighborhood denoted as 112a, 113a for the circuit designs 112, 113, respectively. The neighborhoods 112a, 113a may be considered as areas enclosing the corresponding secondary circuit designs 112, 113 or at least a significant portion thereof and containing a plurality of patterns, which will not contribute to the functionality of the secondary circuit designs 112, 113. For instance, the neighborhoods 112a, 113a may represent a portion of the primary circuit design 111 so that the neighborhoods of the secondary circuit designs 112, 113 may include different circuit patterns, depending on the location within the individual die area 110. For example, the neighborhoods 112a, 113a may define an area extending beyond the secondary circuit designs 112, 113 to approximately 100 μm or more. Since the effect of a plurality of manufacturing processes, such as etch processes, CMP (chemical mechanical polishing) processes, deposition processes, and the like, on a circuit pattern located at a specified substrate position may depend on the neighborhood of this position, in some embodiments of the present invention, the neighborhoods 112a, 113a may be taken into consideration for the generation of electrical measurement data by means of the secondary circuit designs 112, 113. For example, the neighborhoods 112a, 113a, when initially significantly differing from each other, may be designed so as to achieve a high degree of similarity. This may be accomplished by re-positioning the secondary circuit designs 112, 113 such that both the circuit designs are surrounded by similar or identical circuit patterns.

In other embodiments, when re-positioning the secondary circuit designs 112, 113 is a less desirable option, additional "dummy patterns" may be inserted into the layout so as to provide for a sufficient coincidence of the two neighborhoods.

In one illustrative embodiment, the proximity of the secondary circuit designs 112, 113 may advantageously be used to create very different neighborhoods 112a, 113a so as to estimate the influence of very different circuit patterns for otherwise substantially constant process conditions as it may be expected that, due to the small distance between the circuit design 112 and the circuit design 113, substantially the same effect of the manufacturing processes is generated in both of the secondary circuit designs 112, 113.

As previously discussed, a localized secondary circuit design such as the designs 112, 113 may already be provided within the basic circuit design, or correspondingly designed circuits may be provided as test structures, wherein advantageously at least one secondary circuit design is provided within each individual die area. The reduced complexity and reduced layout area for the secondary circuit designs 112, 113 provide for accessibility by test probes at an early manufacturing stage so that the measurement data may represent the entirety of process parameters used prior to the point of time when the measurements are performed. In this way, the delay between obtaining relevant measurement data and the control operation for re-adjusting the lithography process used to form the circuit designs under consideration may significantly be reduced. In particular, process steps such as dicing and packaging of the integrated circuits may be circumvented due to the estimation of the electrical behavior of the circuit on the basis of the electrical performance capability of the sub-devices.

In some embodiments, the initial circuit layout of the reticle 100 may be used, possibly including minor redesign activities, to create a specified neighborhood for the individual secondary circuit designs, thereby obtaining the required measurement data substantially on the basis of the original layout. In other embodiments, the layout of the reticle 100 may be re-arranged so as to comply with a specified measurement geometry.

Figure 1B:
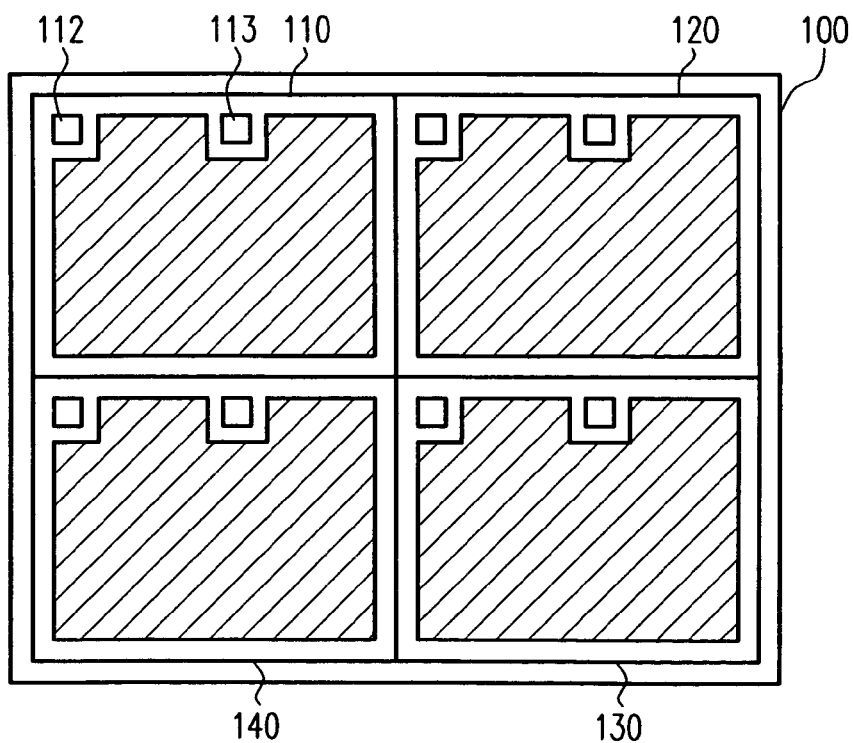

FIG. 1b schematically shows the reticle 100 after a re-arrangement of the secondary circuit designs 112, 113, while maintaining the design of the primary and secondary circuit designs 111 and 112 and 113. The re-arrangement of the secondary circuit designs 112, 113 as shown in FIG. 1b may result in an improved spatial "coverage" of the entire reticle 100, thereby enabling the collection of measurement data that is more representative of the positional distribution of the electrical performance. In the reticle 100 as shown in FIG. 1b, the re-arrangement of the secondary circuit designs 112, 113 is performed in such a way that identical layouts are obtained in each of the individual die areas 110 . . . 140. In other embodiments, it may be considered appropriate to arrange the secondary circuit designs 112, 113 differently in different die areas to obtain a superior coverage of the entire reticle area. Such a re-arrangement may be feasible as long as the different layouts of various individual die areas do not result in any changes of subsequent processes, such as the formation of contact pads or contacts to a package. Regarding the layout design of the neighborhoods of the secondary circuit designs 112, 113, the same criteria apply as previously pointed out with reference to FIG. 1a.

Figure 1C:
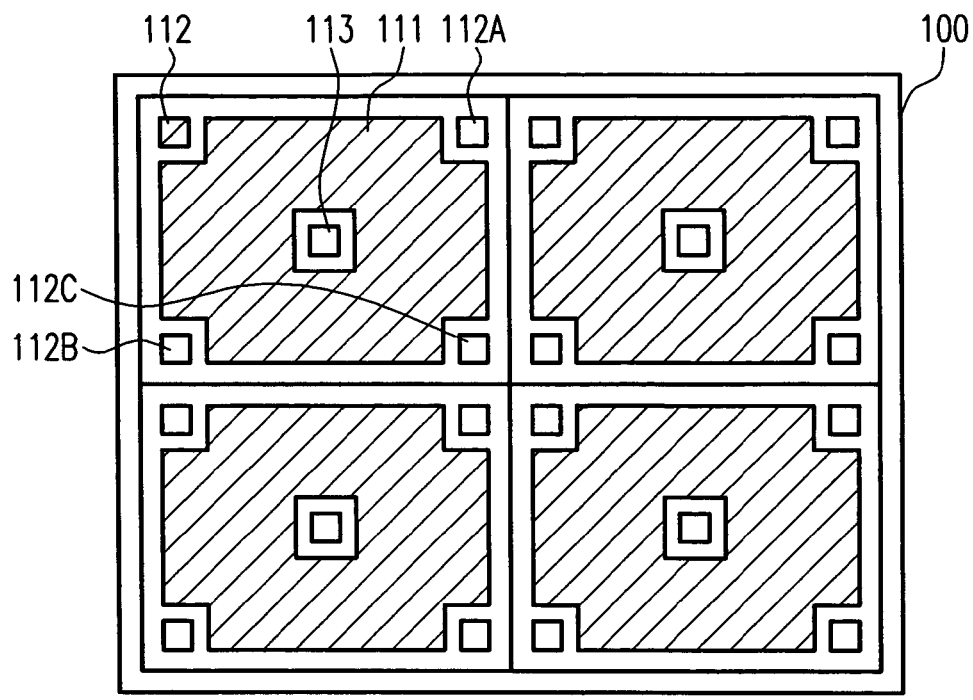

FIG. 1c schematically shows a further variant of the reticle 100 containing four die areas with a circuit design including, for example, five secondary circuit designs of reduced complexity and one primary circuit design of die of high complexity. Due to the increased number of secondary circuit designs that lay be used for collecting electrical measurement data, a superior spatial coverage of the entire reticle area is achieved.

The reticle 100, in its initial form or in a re-arranged form, is then used in combination with a specified lithography tool for producing actual circuit elements, wherein a plurality of process steps are required so as to finally complete hardware representations of the secondary circuit designs 112, 113 in a state which enables the collection of corresponding electrical measurement data. That is, the state of completeness of the hardware representations permits contact with an electrical probe. Corresponding measurement devices for obtaining measurement data from a circuit still provided on a substrate are well-known in the art.

Figure 2A:
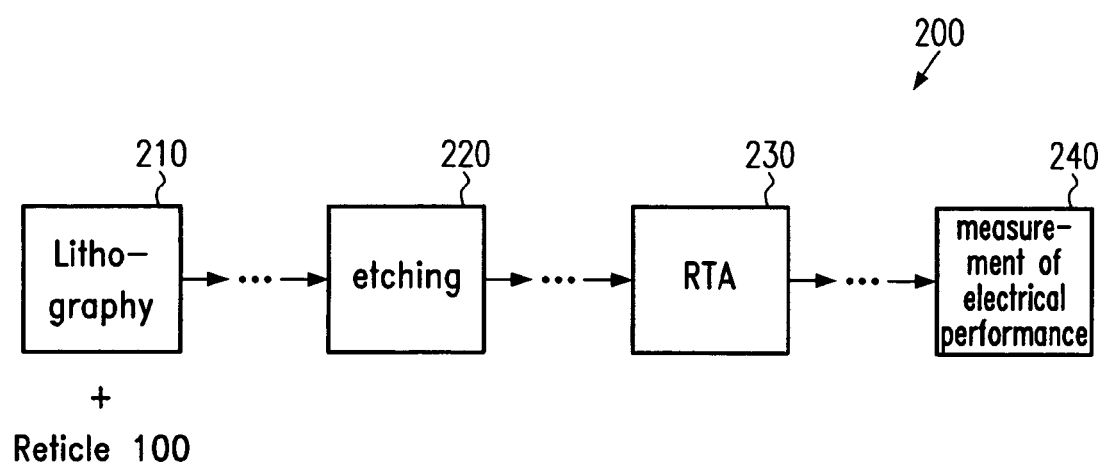
FIG. 2a schematically represents a sequence of manufacturing processes, some of which may significantly affect the performance of an integrated circuit manufactured in accordance with the process sequence.

FIG. 2a schematically shows a process sequence 200 including a plurality of manufacturing steps, starting, for instance, with a lithography process 210 performed with a specified reticle, such as the reticle 100 as shown in FIGS. 1a-1c. It should be appreciated that the lithography process 210 may include all of the processes involved in imaging the reticle 100 onto a resist layer, such as coating a substrate with a specified resist, actually transferring the pattern of the reticle 100 onto a substrate by exposure to UV radiation, post-processing the exposed resist layer, developing the resist, and the like. Moreover, it should be noted that a plurality of lithography tools may be present in a semiconductor facility and a plurality of, in principle, identical reticles may be used, wherein, as previously noted, tool and reticle specific errors may occur so that the process sequence 200 is specified by a specified combination of the tools used, such as the specified reticle used and the specified lithography tool used. After any other intermediate processes, the exposed and developed resist pattern may be etched in a corresponding etch process 220 so as to actually transfer the resist pattern into an underlying material layer. For instance, when the formation of field effect transistors is considered, the lithography block 210 may represent the formation of a resist pattern and the etching block 220 may represent the transfer of the resist pattern into a polysilicon/gate dioxide layer stack, thereby forming a gate electrode structure.

As a further example for a process significantly affecting the device performance of the integrated circuit under consideration, a rapid thermal anneal process 230 is shown, wherein, for instance, the finally obtained dopant profile of source and drain regions is generated. Thereafter, a measurement process 240 is illustrated in which electrical measurement data may be collected from the secondary circuit designs 112, 113, which are now provided as hardware representations on a substrate, wherein the measurement data is indicative of the electrical performance of these hardware representations. In one particular embodiment, the measurement data generated by the measurement process 240 may be indicative of the operating speed of the plurality of hardware representations of the secondary circuit designs 112, 113 within a plurality of reticle fields produced across the substrate surface by means of the reticle 100. For instance, the secondary circuit designs 112, 113 may represent clock oscillators so that, by applying a supply voltage and contacting an output of the secondary circuit designs 112, 113 by means of an appropriate measurement probe, the frequency of the clock signal may easily be determined, which in turn corresponds to the electrical performance, i.e., the operating speed of the secondary circuit designs 112, 113. Since the secondary circuit designs 112, 113 comprise substantially the same components, i.e., transistor elements, capacitors, and the like, as are also present in the primary circuit design 111, which is typically not available for collecting electrical measurement data at this early manufacturing stage, the electrical performance of the secondary circuit designs 112, 113 also represents the performance that can be expected from the primary circuit design 111. Moreover, by collecting the performance data at different positions across the reticle field produced by the reticle 100, the intra-field distribution of the electrical performance across the entire reticle field may be estimated. Furthermore, by collecting corresponding measurement data from a plurality of reticle fields formed on the substrate, in illustrative embodiments from all of the reticle fields formed on the substrate, non-uniformities of the electrical performance across the entire substrate may be estimated. Since the performance measurement data represent the process parameters of the processes involved so far, a corresponding two-dimensional estimation of process parameters is obtained by means of the electrical performance measurement data, irrespective whether these parameters directly affect the critical dimensions or influence the performance via other mechanisms.

From this electrical measurement performance data, different "performance" functions for different reticle locations on the substrate may be determined. Furthermore, different functions including different exposure functions for different reticle field locations may then be established as will be explained in more detail with reference to FIGS. 2a-2d.

As previously explained, the lithography process 210 is an important process, which significantly affects the critical dimensions of circuit features and which also allows the control of process parameters with a positional resolution that is less than the size of a reticle field produced on a substrate. That is, since the exposure dose of a lithography tool may be controlled for a reticle field as a whole, when wafer steppers are considered, or even within a reticle field, when scanners are considered, the local exposure dose may be adapted to process requirements so as to obtain critical dimensions within a specified process margin across the entire substrate surface. According to the present invention, a correlation is established not only between critical dimensions, but instead between performance measurement data representing the entirety of process parameters involved in manufacturing an integrated circuit, in order to at least reduce or compensate for process non-uniformities. For instance, from statistical relevant performance measurement data, which may be obtained by obtaining measurement data from a moderately large number of substrates processed according to the process sequence 200, the exposure dose used during the lithography process 210, which is known in advance by, for instance, performing corresponding measurement runs on a regular basis, the correlation between the performance of the secondary circuit designs 112, 113 at a defined position within a specified reticle field and the corresponding exposure dose used may be identified. For example, the measurement data obtained in the process 240 may indicate that, for substantially the same exposure dose used, the performance at a central position of a specified reticle field is enhanced compared to a peripheral portion of the reticle field. Referring to the reticle 100 as shown in FIG. 1a, a specified reticle field produced by the reticle 100 in accordance with the process sequence 200 may result in hardware representations of the secondary circuit designs 112, 113, which exhibit a high operating speed in the die area 130 representing the central region of the reticle field, compared to, for instance, the corresponding measurement data obtained from the die areas 110 and 140, representing a periphery of the corresponding reticle field. Then, a corresponding quantitative compensation factor for at least a plurality of positions within the reticle field may be estimated on the basis of this correlation, which results in an increased exposure dose at the periphery of the reticle field in subsequent exposure processes. A corresponding plurality of compensation factors may be established for each reticle field on the substrate, thereby significantly reducing the effect of process non-uniformities across the entire substrate area. Appropriate numerical values for the plurality of compensation factors may be obtained by, for example, analyzing the effect of a different exposure dose at a specified position. Such different exposure doses may be generated incidentally owing to process fluctuations of the lithography tool, or may be produced intently during test runs of the tool.

It should be appreciated that especially the control of the exposure dose actually results in a control of critical dimensions, which in turn significantly affect the performance of the integrated circuit. Thus, by actually modifying critical dimensions, any parameter fluctuations, CD-related or not CD-related, of a process sequence may effectively be compensated for.

Figure 2B:
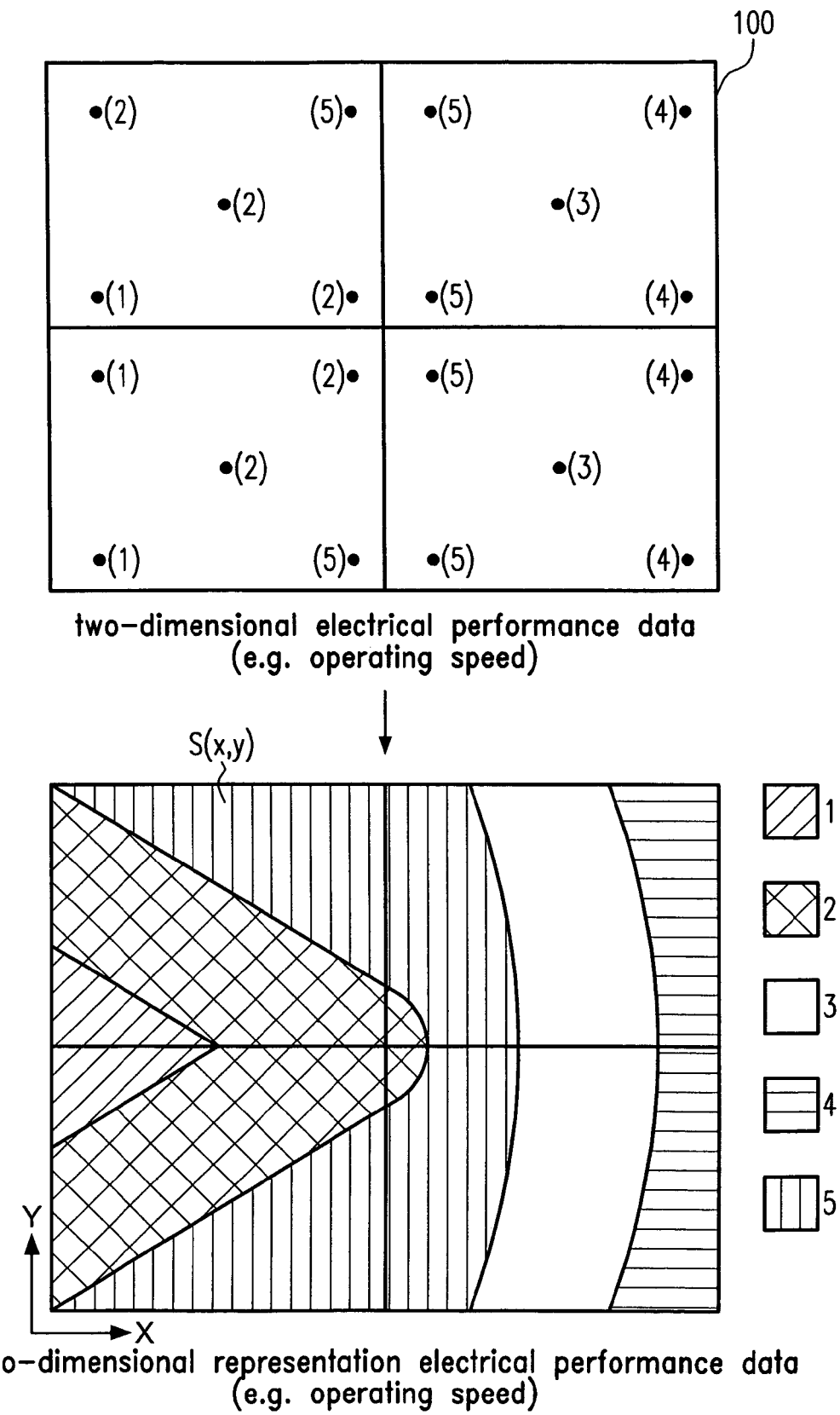
FIG. 2b schematically shows a map of measurement data taken across a single reticle field and the conversion into a substantially continuous two-dimensional representation of the electrical performance data of the integrated circuit.

FIG. 2b schematically shows a further illustrative embodiment in establishing a correlation between electrical performance measurement data and the exposure dose in the lithography process 210. On the left-hand side of FIG. 2b, the electrical performance data is shown as may possibly be obtained during the operation of hardware representations of the secondary circuit designs 112, 113 of the reticle 100 as shown in FIG. 1c. The dots represent the position of the individual secondary circuit designs 112, 113 within the reticle 100, whereas the numbers in brackets represent the corresponding measurement values. For convenience, the numerical values are provided as single numbers and may, for instance, represent the operating speed of the secondary circuit designs 112, 113 at the specified positions. For instance, the number 2 at the uppermost left corner of the reticle 100 may represent the deviation of a clock frequency with respect to a design frequency in Megahertz. It should be appreciated, however, that any other electrical parameter may be used that is appropriate to identify the electrical performance of the secondary circuit designs 112, 113. For example, the delay in responding to an externally supplied signal may be measured and may indicate the performance of the corresponding circuit. The two-dimensional representation of the electrical performance may then be used to control the exposure dose for the lithography process 210. In one particular embodiment, the measurement data as shown in FIG. 2b on the left-hand side may be used as input for a calculation algorithm so as to provide a two-dimensional representation of the electrical performance for the reticle 100, which exhibits a superior spatial coverage for the entire reticle area.

In one embodiment, a substantially continuous two-dimensional representation in the form of a two-dimensional function s(x,y) may be calculated, as is shown on the right-hand side of FIG. 2b. Hence, the function s(x,y) represents the electrical performance, for instance the operating speed at any position x,y within the reticle 100. It should be appreciated that the function s(x,y) may not necessarily be provided in the form of a continuous function, but may also be represented as an array of discrete values so as to define a lattice of performance data, wherein the lattice is significantly denser than the corresponding array provided by the pure measurement data as shown on the left side of FIG. 2b. Calculating the function s(x,y) from the raw measurement data may be accomplished by any known methods, such as least square method or a second order fit. The provision of the function s(x,y) may significantly facilitate the task of finding an appropriate correlation between the raw measurement data as obtained by the process 240 and the exposure dose used in the lithography process 210.

In one particular embodiment, the performance measurement data obtained from each of the reticle fields formed on a substrate are used, wherein the calculation for finding the function s(x,y) is performed separately for each of the reticle fields, thereby providing an individual function s(x,y) for each individual reticle field. In this way, the entire substrate surface is represented by the measurement data and a corresponding control may be performed so as to also compensate for across-substrate variations. That is, a corresponding exposure function may be established for each individual function s(x,y) to take into account differences of intra-field variations at different reticle field locations. In other embodiments, in addition or alternatively, the calculation for obtaining the function s(x,y) is based on the average of a plurality of substrate lots, wherein measurement data corresponding to the same reticle field within different substrates are averaged. Hence, the reliability of the function s(x,y) is significantly enhanced owing to the statistical relevance of the measurement data input into the calculation. In one embodiment, the function s(x,y) may be determined for any combinations of process tools used in the process sequence 200. For instance, corresponding functions s(x,y) may be determined for any combination of reticles 100 and lithography tools used in the process 210, whereas, in other embodiments, a plurality of sets of functions s(x,y) may be established for any possible combination of process tools within the entire process sequence 200. Thus, for instance, using a different etch system in the process 220 results in a specified function s(x,y) for each of the reticle fields produced on one or more substrates for the sequence 200 performed with this different etch tool.

In one particular embodiment, the function s(x,y) is not directly used for controlling the lithography process 210 but instead is translated into a corresponding two-dimensional map for representation of critical dimension. That is, although the electrical performance of the secondary circuit designs 112, 113 may be influenced by a variation of critical dimension and by other process parameters that do not directly affect the actual critical dimensions, for instance the gate length of a field effect transistor, a corresponding relationship between critical dimensions and the performance data is established as the lithography process to be controlled on the basis of the measurement data actually changes the critical dimensions only. In this way, process parameters not relevant for the critical dimension but relevant for the final electrical performance may be translated into a corresponding critical dimension that would result in the same device performance. For example, as previously explained, the operating speed of the field effect transistor is, in addition to the gate length, also determined by the parameters of the rapid thermal annealing 230 which has a significant influence on the dopant profile and, thus, on the effective channel length. If, for example, measurement data indicate that the operating speed at a specified position is too high compared to a reference value, the lithography process 210 may be controlled so as to produce a somewhat enlarged gate length, thereby compensating for non-uniformity of the anneal process 230. Since a relation between an operating speed and a relevant critical dimension, that is the gate length of a transistor, is well known in advance, for instance by previously obtained measurement data, the function s(x,y) may readily be converted into a corresponding two-dimensional representation of the critical dimensions denoted as CD(x,y).

Figure 2C:
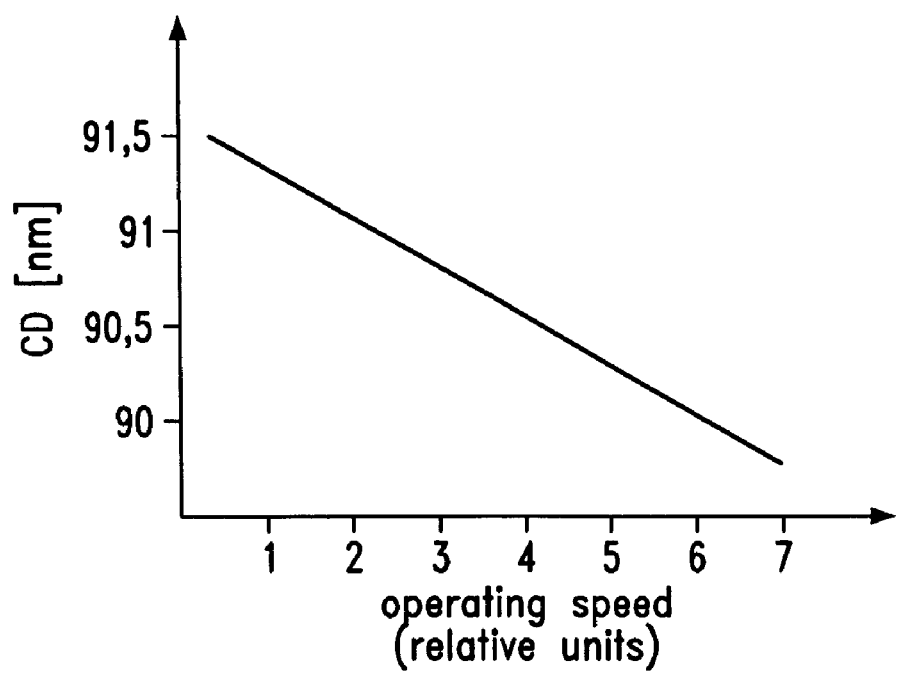
FIGS. 2c and 2d schematically depict plots of a relation between an operating speed and a CD, and between a CD and an exposure dose, respectively.

FIG. 2c schematically shows an exemplary illustration of the dependence of the operation speed of a specified circuit element, such as a transistor element, with respect to its critical dimension. As is indicated by FIG. 2c, an increased critical dimension results in a reduced operating speed and vice versa. Thus, the two-dimensional function CD(x,y) may be obtained via the relation shown in FIG. 2c, thereby resulting in a two-dimensional function that may have a similar form as shown in FIG. 2b on the right-hand side for the function s(x,y). The advantage of representing the performance measurement data in the form of a two-dimensional map of the critical dimensions resides in the fact that corresponding control strategies in compensating for CD variations by controlling the exposure dose of a lithography tool are well established in the art and may thus be used in combination with the present invention.

Hence, in one particular embodiment of the present invention, the electrical performance measurement data may be obtained in an early manufacturing stage according to the process sequence 200 so as to establish the function CD(x,y) for the specified tool combination in the sequence 200 with as small a delay as possible with respect to the lithography process 210. For instance, the measurement data, for example the operating speed, may be obtained for only some of the individual reticle fields, wherein the measurement data may be sufficient to allow the detection of a deviation to a previously established function s(x,y). The measurement data, possibly in reduced form, may then be used to produce an updated function s(x,y). Based on this updated function s(x,y), indicating for instance a significant deviation, a corresponding updated function CD(x,y) may be calculated and may be used to correspondingly adjust the exposure dose of the lithography process 210. A corresponding control strategy may be implemented in the form of an appropriate APC (Advanced Process Control) algorithm. This APC algorithm may be based on a previously established relation between an exposure dose and a corresponding critical dimension.

Figure 2D:
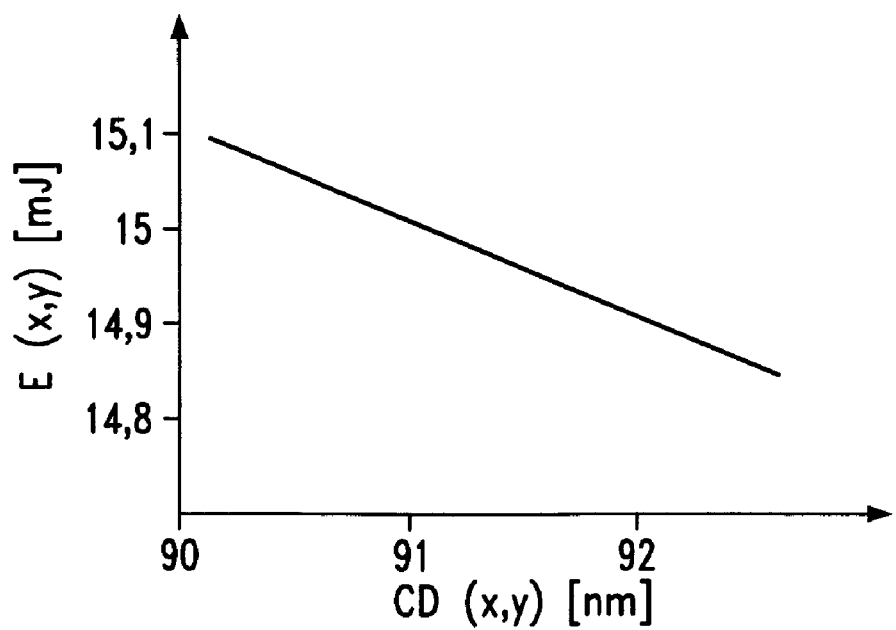

FIG. 2d schematically shows an exemplary correlation between exposure dose, represented by a function e(x,y), with respect to a critical dimension, represented by the function CD(x,y). Hence, by means of the relation shown in FIG. 2d, the APC algorithm may determine an appropriate exposure dose at the position x,y so as to produce the critical dimension at this position required to compensate for a process non-uniformity indicated by the updated function s(x,y), wherein the required critical dimension is obtained by comparing the updated function CD(x,y), representing the most recent measurement values of the electrical performance, and a reference function of critical dimensions that may be established on the basis of a plurality of statistically relevant measurement data. The reference function of the critical dimensions may advantageously be established such that the electrical performance is substantially uniformly distributed across the entire substrate are. However, other control strategies may be used to create an appropriate exposure dose in the lithography process 210.

A method of adapting the exposure dose e(x,y) in accordance with a required target value is also described in U.S. Pat. No. 6,493,063, the entire disclosure of which is hereby incorporated by reference.

Due to the correlation between the critical dimension, for example represented by the function CD(x,y), and the electrical performance of the integrated circuit, for instance represented by the function s(x,y), any deviation of the process sequence 200 may, according to one particular embodiment, be detected by using a special metrology reticle instead of the reticle 100. The metrology reticle may, for instance, contain a large number of equally designed modules with patterns of critical dimensions. These modules may be measured by any known methods, such as optical methods to estimate the currently prevailing state of the process sequence, wherein, in one particular embodiment, the measurement of the critical dimensions produced by the metrology reticle may be obtained by an electrical measurement. To this end, the resistance of a polysilicon line may be determined, which changes in a predictable manner, when the critical dimension, i.e., the width of the silicon line, changes. In this way, a highly efficient and fast measurement method is achieved so as to detect any process fluctuations on a regular basis without requiring actual performance measurement data from product substrates.

Figure 3:
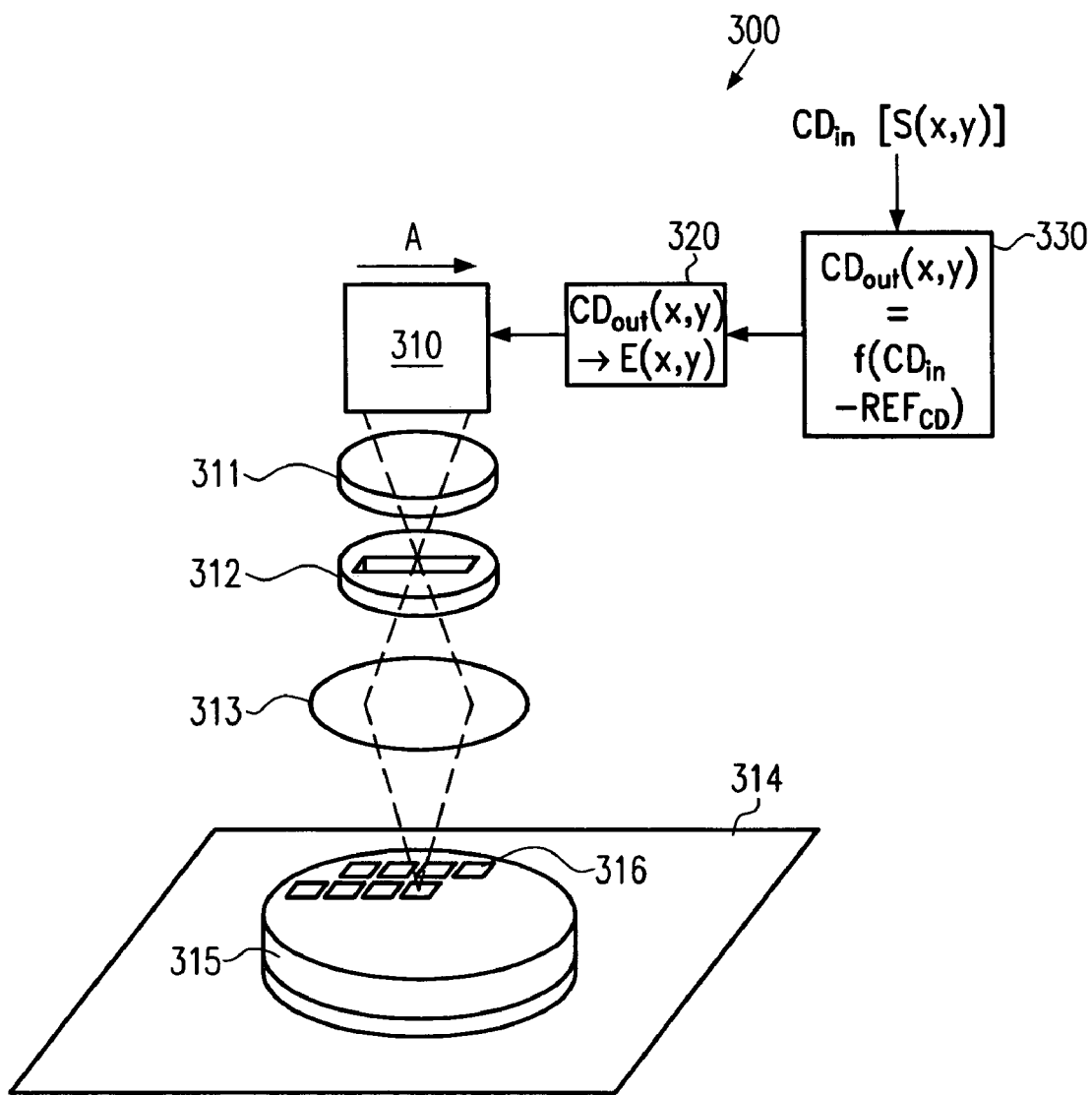
FIG. 3 schematically illustrates a lithography system configured to be controlled on the basis of measurement data indicating an electrical performance of secondary circuits.

FIG. 3 schematically shows a lithography system 300 that may be used in the lithography process 210. The system 300 comprises an illumination system 310, the reticle 100 or a metrology reticle, a reduction lens system 313 and means 311 for adjusting an exposure dose of the illumination system 310. For instance, the means 311 may comprise gray filters, means for controlling the intensity of the illumination system 310, and the like. Corresponding means for controlling the exposure dose are well known in the art. Moreover, a movable substrate holder 314 is provided, on which a substrate 315 is positioned having formed thereon a plurality of reticle fields 316. The system 300 further comprises a control section 320 that is configured to convert a signal representing a critical dimension at a substrate position x,y into a respective exposure dose for the position x,y. Moreover, the system 300 comprises a control unit 330 configured to receive data representing critical dimensions indicative of electrical performance data wherein the control unit 330 is further adapted to produce corresponding output values $CD_{out}$, which are a function of the received critical dimension values $CD_{in}$ and reference CD data representing target values of the critical dimensions with respect to a desired electrical performance of the circuit under consideration. Hence, the system 300 is configured to perform the above-explained APC algorithm so as to reduce or compensate for effects of parameter fluctuations of the process sequence 200.

During operation of the system 300, CD data $CD_{in}$ representing, for instance the two-dimensional function s(x, y) may be received, for instance by a further control unit (not shown) or by any other system, such as a facility management system, and the like. The control unit 330 then calculates on the basis of the input data $CD_{in}$ and reference CD data representing a desired behavior of the integrated circuit under consideration corresponding CD values $CD_{out}$ that compensate for the deviation indicated by the received CD data $CD_{in}$. The corresponding compensation values $CD_{out}$ are transmitted to the control section 320, which generates, for instance on the basis of well-established control strategies, or by the above-described relations explained with reference to FIGS. 2c-2d corresponding exposure dose values e(x,y), which are then used for producing the plurality of reticle fields 316 on the substrate 315.

It should be appreciated that the above-described feedback strategy on the basis of the electrical measurement data obtained at an early manufacturing stage enhances the efficiency of compensating for process variations compared to the conventional approach. The efficiency may still further be increased in that measurement data obtained from one or more processes of the sequence are also related to the performance measurement data so that the feedback loop may, at least partially, be shortened. For example, measurement results obtained after the RTA process 230 may be correlated to the operating speed data. A corresponding correlation may then be used to respond significantly faster to process variations than is possible by obtaining updated performance data. Although the RTA data may possibly lack information about the spatial resolution of a process variation, the data may nevertheless indicate an overall drift, which may be accounted for by adapting the exposure dose by one of the algorithms described above.

As a result, the present invention provides a technique in which measurement data indicative of an electrical performance of secondary circuit designs, for instance the operating speed of secondary circuits associated with a highly complex primary circuit design, are used to detect process non-uniformities of a process sequence and to compensate for or reduce the effects of these process non-uniformities by establishing a correlation between the measurement data and the exposure dose used for performing a lithography process. Since a plurality of measurement points is available within a single reticle field, a high degree of spatial coverage is achieved, thereby providing the potential to determine a substantially continuous function of values representing the electrical performance, e.g., the operating speed of the device under consideration. According to some embodiments, based on this two-dimensional representation or map of the electrical behavior of the circuit, a corresponding CD map may be established, which, in turn, may be used in appropriately controlling the lithography tool. Hence, by using intra-field measurement data, not only CD-induced process fluctuations but also any other parameter variations may be compensated for by correspondingly adapting the critical dimension of the circuit under consideration.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of controlling lithographic processes based on electrical performance of functional electrical circuit portions formed on a substrate, comprising:

measuring the electrical performance of each of a plurality of functional circuit portions of a specified design arranged within a reticle field formed on a substrate to obtain measurement data indicative of the electrical performance of the plurality of functional circuit portions the functional circuit portions comprising a first functional circuit portion with a first neighborhood and a second functional circuit portion with a second neighborhood adjacent to each other, wherein the pattern density in the first neighborhood differs from a pattern density in the second neighborhood determining a two-dimensional representation of said electrical performance for said reticle field on the basis of said measurement data; and controlling a lithographic process of one or more product substrates on the basis of said two-dimensional representation.

2. The method of claim 1, wherein said reticle field comprises at least one primary circuit formed according to a primary circuit design, the method further comprising re-designing a layout for said reticle field so as to position said plurality of functional circuit portions as an array while maintaining said specified design and said primary circuit design.

3. The method of claim 2, further comprising re-arranging the layout of said reticle field so as to generate a neighborhood of each of said functional circuit portions in accordance with specified measurement criteria while maintaining said specified design and said primary circuit design.

4. The method of claim 3, wherein said neighborhoods are similar for at least some of the plurality of functional circuit portions.

5. The method of claim 4, wherein a pattern density in said neighborhoods of said at least some of the plurality of functional circuit portions is substantially identical.

6. The method of claim 5, further comprising forming a dummy pattern in one or more of said neighborhoods so as to achieve said substantially identical pattern density.

7. The method of claim 3, further comprising arranging the first functional circuit portion with the first neighborhood and the second functional circuit portion with the second adjacent to each other.

8. The method of claim 1, wherein controlling said lithographic process comprises determining a two-dimensional representation of a critical dimension used in forming said functional circuit portions on the basis of said measurement data.

9. The method of claim 8, wherein controlling said lithographic process further comprises adjusting an exposure dose within said reticle field on the basis of a relation between said critical dimension and an exposure dose required to obtain said critical dimension.

10. The method of claim 8, further comprising establishing a reference representation of critical dimensions on the basis of said two-dimensional representation of said critical dimension.

11. The method of claim 10, further comprising monitoring critical dimensions for a specified process sequence and controlling said lithographic process on the basis of the monitored critical dimensions and said reference representation.

12. The method of claim 11, wherein monitoring the critical dimensions is performed by using a test reticle.

13. The method of claim 1, wherein said measurement data include measurement data related to a specified combination of a reticle and a lithography tool used for forming said functional circuit portions.

14. The method of claim 1, wherein said measurement data include measurement data related to a specified process sequence used for forming said functional circuit portions.

15. The method of claim 14, wherein said process sequence includes at least one of a lithography process with a specified reticle, an etch process and a rapid thermal anneal process.

16. The method of claim 15, wherein said measurement data include data representing at least a plurality of combinations of process tools used in said process sequence.

17. The method of claim 1, wherein said measurement data are obtained from a plurality of substrates as average values.

18. The method of claim 1, wherein one or more further reticle fields are formed on said substrate and corresponding two-dimensional representations are determined on the basis of measurement data obtained from said one or more further reticle fields.

19. The method of claim 18, wherein said lithography process is controlled on the basis of said corresponding two-dimensional representations.

20. The method of claim 1, wherein measuring the electrical performance of each of the plurality of functional circuit portions comprises measuring a plurality of operating speeds of the plurality of functional circuit portions.

21. The method of claim 20, wherein measuring the plurality of operating speeds of the plurality of functional circuit portions comprises measuring a plurality of clock speeds of a plurality of clock circuits.

22. A method of controlling lithographic processes based on electrical performance of electrically functional circuits formed on a substrate, comprising:

designing a layout for a reticle including a plurality of primary electrically functional circuit designs, each of which being associated with at least one electrically functional secondary circuit design of reduced complexity;

forming a hardware representation of said layout on a substrate by process tools including a lithography apparatus using said reticle;

obtaining measurement data indicative of an electrical performance of said electrically functional secondary circuits; and determining, on the basis of said measurement data, a map relating a critical dimension of said layout to a position within a reticle field formed on said substrate.

23. The method of claim 22, further comprising controlling a lithographic process for fabricating hardware representations of said layout on at least one product substrate on the basis of said map.

24. The method of claim 23, wherein controlling said lithographic process further comprises adjusting an exposure dose within said reticle field on the basis of a relation between said critical dimension and an exposure dose required to obtain said critical dimension.

25. The method of claim 24, wherein a plurality of reticle fields is provided and an exposure dose is individually adjusted for each reticle field.

26. The method of claim 22, wherein determining said map comprises determining for a plurality of positions the electrical performance of said electrically functional secondary circuits to obtain a two-dimensional representation of the electrical performance.

27. The method of claim 26, further comprising relating said two-dimensional representation to a relation between the electrical performance and a critical dimension to obtain said map.

28. The method of claim 22, further comprising designing the layout of said reticle so as to generate a neighborhood of each of said electrically functional secondary circuit designs in accordance with specified measurement criteria while maintaining said primary and secondary electrically functional circuit designs.

29. The method of claim 28, wherein said neighborhoods are similar for at least some of electrically functional the secondary circuit designs.

30. The method of claim 29, wherein a pattern density in said neighborhoods of said at least some of the electronically functional secondary circuit designs is substantially identical.

31. The method of claim 30, further comprising forming a dummy pattern in one or more of said neighborhoods so as to achieve said substantially identical pattern density.

32. The method of claim 28, further comprising arranging a first electrically functional secondary circuit design with a first neighborhood and a second electrically functional secondary circuit design with a second neighborhood adjacent to each other, wherein a pattern density in the first neighborhood differs from a pattern density in the second neighborhood.

33. The method of claim 22, wherein said measurement data include measurement data related to a specified combination of a reticle and a lithography tool used for forming said hardware representation.

34. The method of claim 22, wherein said measurement data include measurement data related to a specified process sequence used for forming said hardware representation.

35. The method of claim 34, wherein said process sequence includes at least one of a lithography process with a specified reticle, an etch process and a rapid thermal anneal process.

36. The method of claim 34, wherein said measurement data include data representing at least a plurality of combinations of process tools used to perform said process sequence.

37. The method of claim 22, further comprising establishing a reference map of critical dimensions on the basis of said map.

38. The method of claim 37, further comprising monitoring critical dimensions for a specified process sequence and controlling a lithographic process on the basis of the monitored critical dimensions and said reference map.

39. The method of claim 38, wherein monitoring the critical dimensions is performed by using a test reticle.

40. The method of claim 22, wherein obtaining measurement data indicative of the electrical performance of said electrically functional secondary circuits comprises obtaining measurement data indicative of operating speeds of each of said electrically functional secondary circuits.

41. The method of claim 40, wherein obtaining the measurement data indicative of operating speeds of each of said electrically functional secondary circuits comprises obtaining measurement data indicative of a plurality of clock speeds of a plurality of clock circuits.

* * * * *